US012565099B2

(12) United States Patent　　　　(10) Patent No.:　US 12,565,099 B2

Ive et al.　　　　　　　　　　　　　(45) Date of Patent:　　　Mar. 3, 2026

(54) CONTROL PANEL WITH TILTABLE SCREEN FOR A VEHICLE

(71) Applicant: FERRARI S.P.A., Modena (IT)

(72) Inventors: Jonathan P. Ive, San Francisco, CA (US); Eugene Whang, San Francisco, CA (US); Jeremy Bataillou, San Francisco, CA (US); Anthony Ashcroft, San Francisco, CA (US); Suhang Zhou, San Francisco, CA (US); Benoit Louzaouen, San Francisco, CA (US); Jemima Kiss, San Francisco, CA (US); Christopher Wilson, San Francisco, CA (US); Wan Si Wan, San Francisco, CA (US); Biotz Natera, San Francisco, CA (US); James McGrath, San Francisco, CA (US); Roger Guyett, San Francisco, CA (US); Joseph Luxton, San Francisco, CA (US); Michael Matas, San Francisco, CA (US); Patrick Kessler, San Francisco, CA (US); Maximilian Romani, Modena (IT); Vito Conigliaro, Modena (IT); Matteo Lanzavecchia, Modena (IT)

(73) Assignee: FERRARI S.P.A., Modena (IT)

( * ) Notice: Subject to any disclaimer, the term of this patent is extended or adjusted under 35 U.S.C. 154(b) by 250 days.

(21) Appl. No.: 18/499,480

(22) Filed: Nov. 1, 2023

(65) Prior Publication Data

US 2024/0149677 A1　　May 9, 2024

(30) Foreign Application Priority Data

Nov. 4, 2022　(IT) ........................ 102022000022770

(51) Int. Cl.
　　H05K 5/02　　　(2006.01)
　　B60K 35/00　　(2006.01)
　　　　　(Continued)

(52) U.S. Cl.
　　CPC ........... *B60K 35/00* (2013.01); *H05K 5/0217* (2013.01); *B60K 35/22* (2024.01); *B60K 35/28* (2024.01);
　　　　　(Continued)

(58) Field of Classification Search
　　CPC .... H05K 5/0017; H05K 5/0217; B60K 35/00; B60K 35/28; B60K 35/53
　　　　　(Continued)

(56) References Cited

U.S. PATENT DOCUMENTS

| | | |
|---|---|---|
| 5,237,455 A | 8/1993 | Bordo et al. |
| 2002/0149544 A1 | 10/2002 | Rosen et al. |

(Continued)

FOREIGN PATENT DOCUMENTS

| | | |
|---|---|---|
| DE | 202015103992 U1 | 10/2015 |
| DE | 102015011614 A1 | 3/2017 |
| JP | H02241843 A | 9/1990 |

OTHER PUBLICATIONS

Italian Search Report for Application No. 202200022770; Filing Date: Nov. 4, 2022; Date of Mailing: Apr. 26, 2023; 6 pages.

(Continued)

*Primary Examiner* — Hung S. Bui

(74) *Attorney, Agent, or Firm* — CANTOR COLBURN LLP

(57)　　　　　ABSTRACT

The control panel for a vehicle and having: a support body having its own front wall; and at least one displaying device which is configured to display information and is housed in the support body in the area of the front wall. The support body is mounted in a rotary manner so as to rotate around a (Continued)

rotation axis between a first position, in which the front wall of the support body is arranged substantially vertically to be viewed and a second position, in which the front wall of the support body is arranged substantially horizontally and faces downward to be hidden from the view.

13 Claims, 9 Drawing Sheets

(51) Int. Cl.
    *B60K 35/22*          (2024.01)
    *B60K 35/28*          (2024.01)
    *B60K 35/53*          (2024.01)
(52) U.S. Cl.
    CPC ........ *B60K 35/53* (2024.01); *B60K 2360/167*
                                                    (2024.01)
(58) Field of Classification Search
    USPC ........................................ 361/807, 809, 810
    See application file for complete search history.

(56)                     References Cited

U.S. PATENT DOCUMENTS

2018/0118031 A1      5/2018  Crijns et al.
2020/0039444 A1      2/2020  Rook et al.

OTHER PUBLICATIONS

European Search Report of European Patent Application No. 23206902.
1, Date of Mailing: Feb. 27, 2024, 8 pages.

CONTROL PANEL WITH TILTABLE SCREEN FOR A VEHICLE

CROSS-REFERENCE TO RELATED APPLICATIONS

This patent application claims priority from Italian patent application no. 102022000022770 filed on Nov. 4, 2022, the entire disclosure of which is incorporated herein by reference.

FIELD OF THE ART

The present invention relates to a control panel for a vehicle.

The present invention finds advantageous application to the control panel of a car, to which the following description will make explicit reference without thereby losing generality.

PRIOR ART

A car comprises a dashboard, which constitutes the front wall of the passenger compartment positioned below the windscreen. The dashboard supports a control panel, which is arranged in front of the driver immediately behind the wheel.

In the past, the control panel only comprised analogue hand instruments and some indicator lights; small digital screens progressively appeared which with the time passing by have become increasingly large and defined to show increasingly complex images until they have become completely programmable. Initially, the digital screens replaced the odometer and some indicator lights, later they replaced the secondary analogue instruments (such as for example the residual fuel indicator and the clock), and finally in some cases they also replaced the main analogue instruments (i.e. the tachometer and the rev counter) creating a completely digital instrumentation.

The completely digital instrumentation is normally highly appreciated in the "quiet" driving (particularly in the city), as being completely programmable it allows to highlight the information useful for driving (for example the speed of the vehicle which is essential information for the compliance with the limits imposed by law and the navigator) so that the information useful for driving is easily and immediately readable without having to distract one's eyes excessively from the road. However, the completely digital instrumentation is generally less appreciated in the "sporty" driving, particularly in track driving, as it is considered less readable with immediacy (i.e. it requires greater attention to acquire the information shown by the instrumentation since a quick "glance" is generally not enough).

In the high-performance sports cars currently in production, a compromise is normally chosen that provides for the presence of a single analogue instrument that indicates the revolutions of the engine (i.e. a rev counter) flanked by one or two digital screens; however, this solution is a compromise that generally penalizes both the analogue instrument (which cannot be very large so as not to take the digital screens too much space away), and the digital screens (which are compulsorily relatively small in size so as not to overlap the analogue instrument and therefore are unsuitable for showing a detailed cartographic navigator that is instead highly appreciated especially in city driving).

Patent EP3138722B1 describes a control panel comprising a digital screen and an analogue instrument provided with a support element of circular shape and with a hand that moves inside the support element; the analogue instrument is movable so as to be moved only when needed to a working position, in which the analogue instrument is overlapped on the digital screen so that the support element of the analogue instrument covers a corresponding part of the digital screen.

Patent application US2018118031A1 describes a displaying group for a vehicle comprising a displaying unit provided with a first displaying panel configured to display a first set of instruments and a second displaying panel configured to display a second set of instruments; the displaying unit is movable between a first position, in which the first displaying panel faces the driver and a second position, in which the second displaying panel faces the driver.

DISCLOSURE OF THE INVENTION

Aim of the present invention is to provide a control panel for a vehicle that allows the information to be displayed so that the driver can, in all the driving situations, acquire the data he needs with the minimum possible distraction.

According to the present invention there is provided a control panel for a vehicle, according to what is claimed in the appended claims.

The claims describe preferred embodiments of the present invention forming an integral part of the present disclosure.

BRIEF DESCRIPTION OF THE DRAWINGS

The present invention will now be described with reference to the enclosed drawings, showing some non-limiting embodiments thereof, wherein.

PREFERRED EMBODIMENTS OF THE INVENTION

Figure 1:
FIGS. 1 and 2 are two schematic views of a car provided with a control panel which is made in accordance with the present invention and is arranged in two different configurations.

In FIG. 1, number 1 denotes as a whole a road vehicle (in particular a car) provided with two driven and steering front wheels and with two driving rear wheels, which receive the driving torque from a powertrain system (alternatively all four wheels could be driving wheels or only the two front wheels could be driving wheels).

According to what is shown in FIG. 1, the road vehicle 1 comprises a passenger compartment 2 delimited frontally by a dashboard 3 which is arranged below a windscreen 4. The dashboard 3 supports a control panel 5, which is arranged in front of a driver behind a steering wheel 6. In particular, the control panel 5 is arranged above a support body that internally houses the steering column (i.e. the element to one end of which the steering wheel 6 is mounted).

Figure 3:
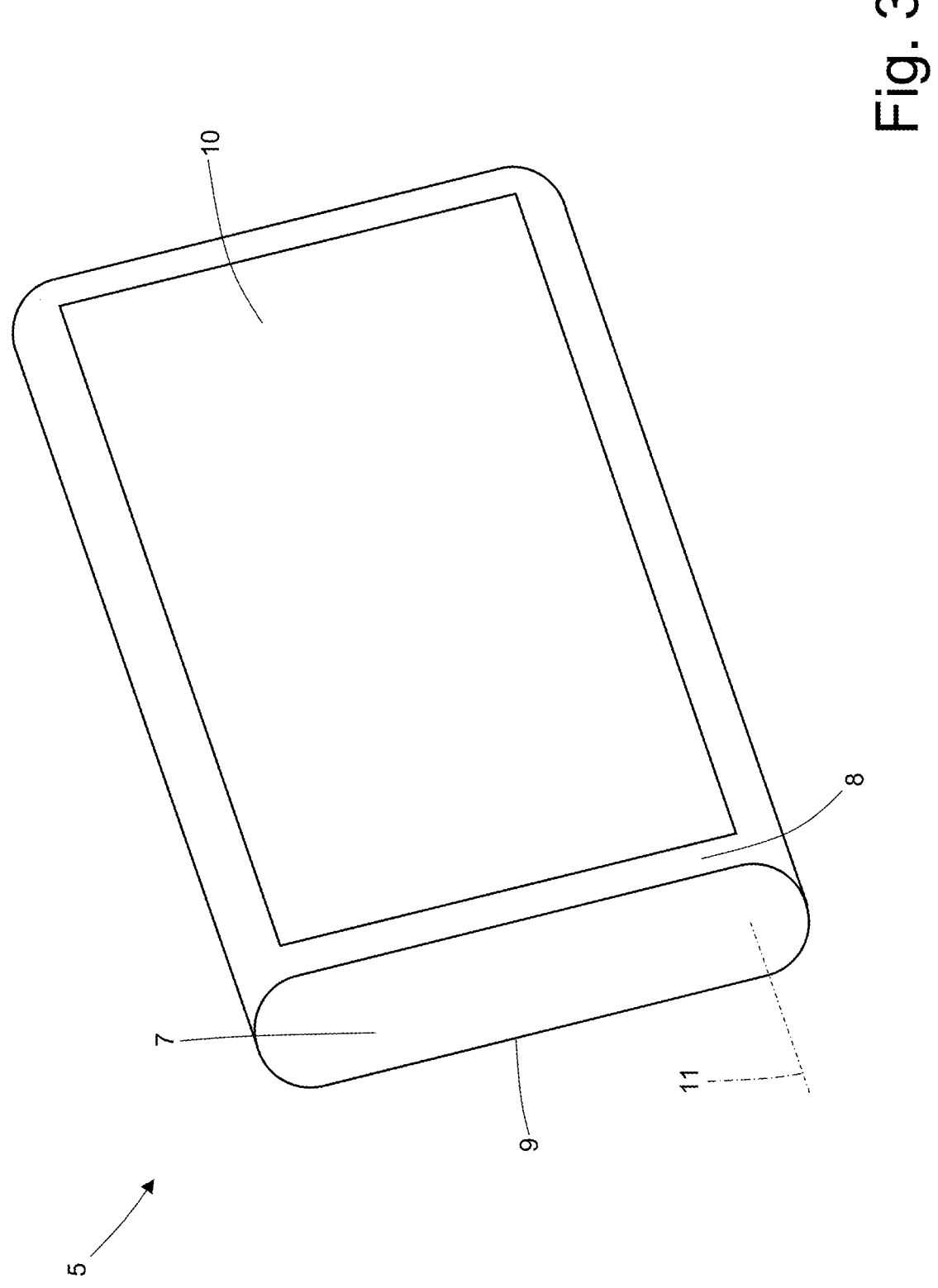
FIG. 3 is a perspective and schematic view of the control panel of FIGS. 1 and 2.
Figure 4:
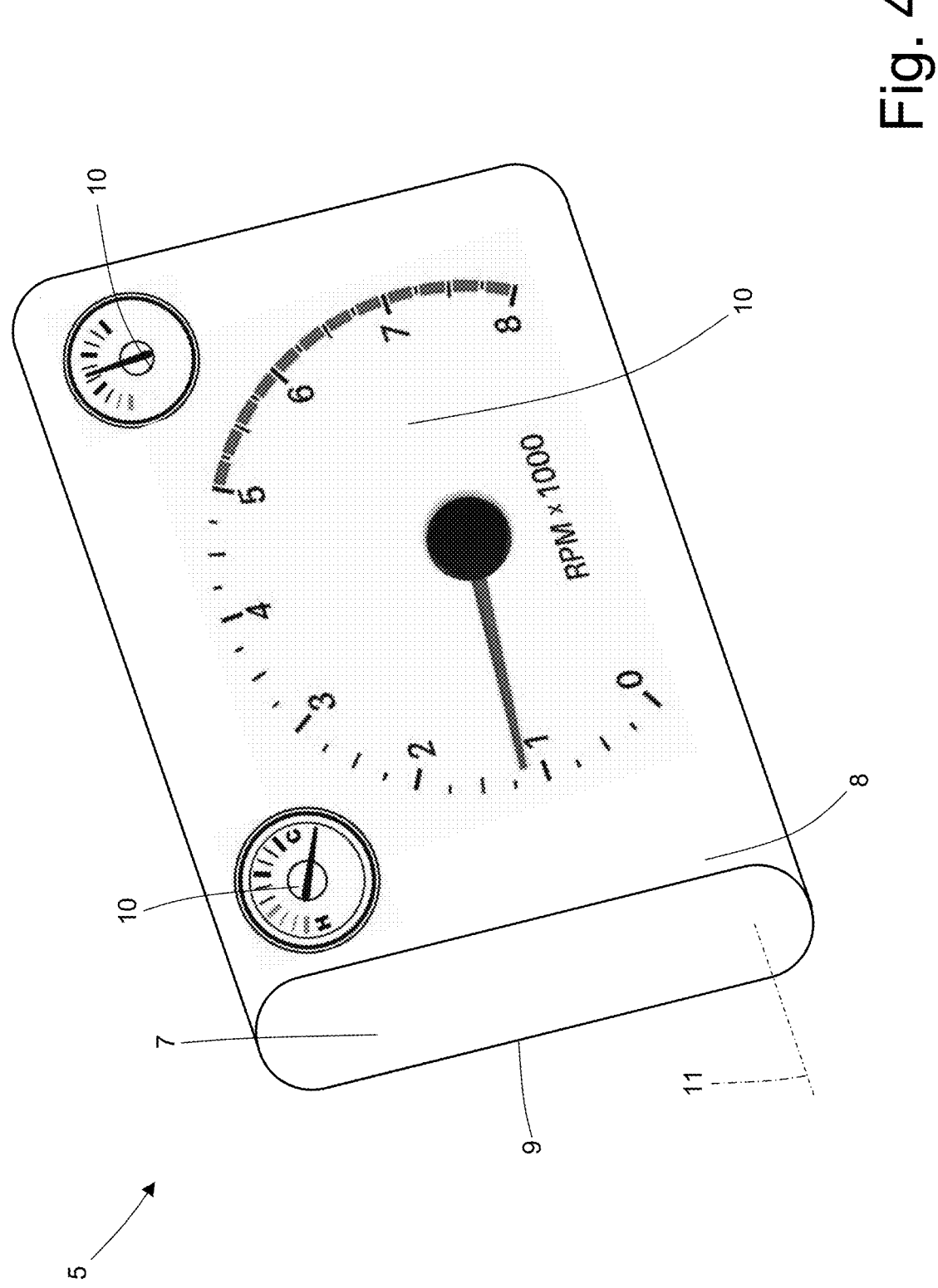
FIG. 4 is a perspective and schematic view of a variant of the control panel of FIGS. 1 and 2.

According to what is better shown in FIGS. 3 and 4, the control panel 5 comprises a support body 7 which has an approximately parallelepiped shape and has its own flat front wall 8 and its own flat rear wall 9 which is parallel to and opposite the front wall 8 (the two walls 8 and 9 constitute the two larger faces of the support body 7). The control panel 5 comprises (at least) a displaying device 10 which is configured to display information and is housed in the support body 7 in the area of the front wall 8.

In the embodiment shown in FIG. 3, the displaying device 10 is completely digital and comprises a single digital screen (for example made with the LED technology or with the OLED technology) that entirely occupies the front wall 8 of the support body 7. In the alternative embodiment shown in FIG. 4, the displaying device 10 is completely analogue and comprises a series of analogue instruments each provided with at least one hand. According to a further embodiment not shown, the displaying device 10 is partly analogue and partly digital and comprises both at least one digital screen (for example made with the LED technology or with the OLED technology), and at least one analogue instrument provided with a hand.

Figure 2:
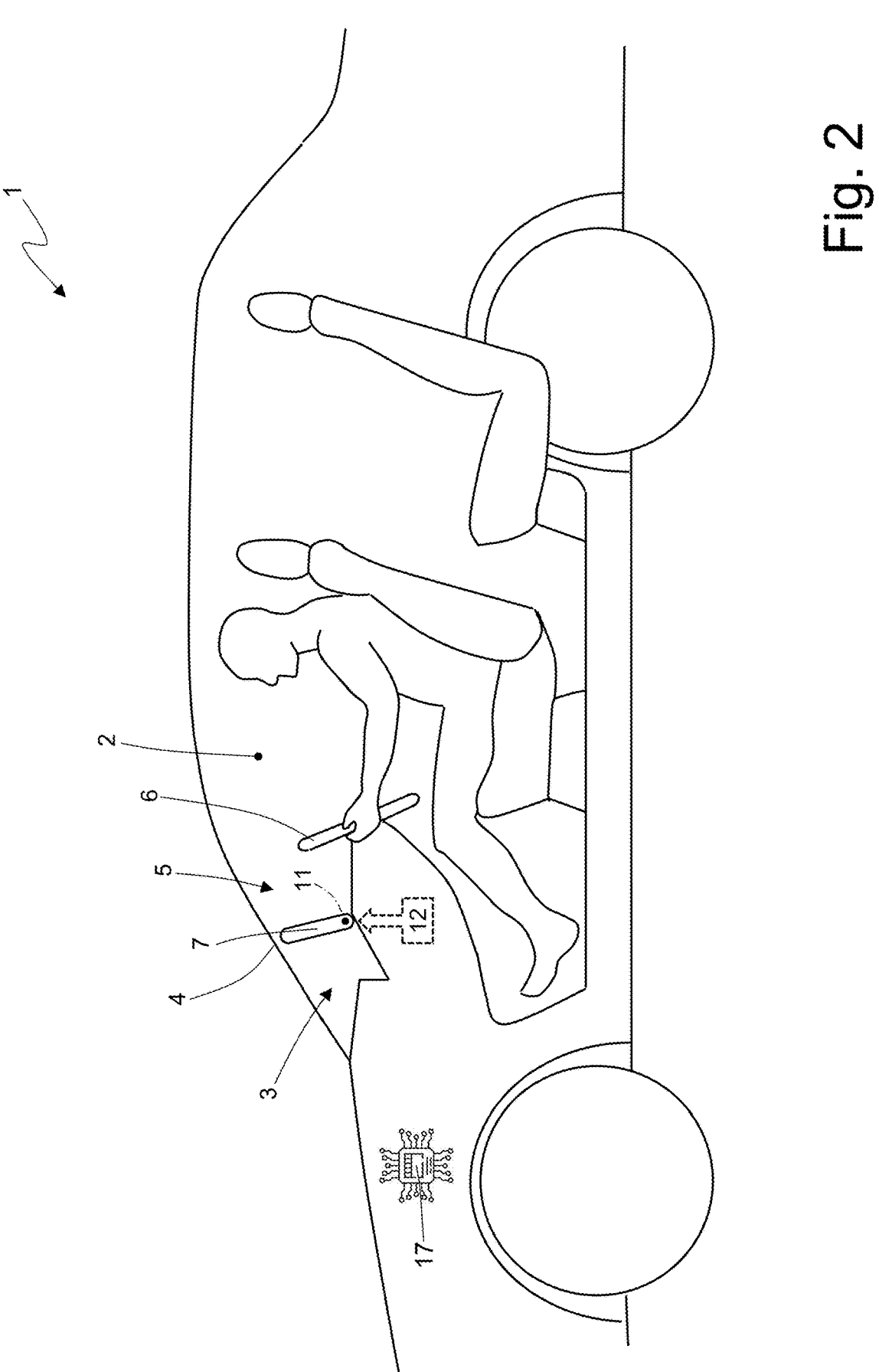

The support body 7 is mounted in a rotary manner so as to rotate around a rotation axis 11 between a first position (shown in FIGS. 2, 3 and 4) in which the front wall 8 of the support body 7 is arranged substantially vertically (actually slightly inclined by a few degrees with respect to the vertical so as to be more easily readable by the driver whose head is arranged higher than the control panel 5) to be viewed by the driver of the vehicle 1 (i.e. visible to the driver) and a second position (shown in FIG. 1) in which the front wall 8 of the first support body 7 is arranged substantially horizontally and faces downward (i.e. it is facing or resting on an upper wall of a dashboard 3 of the vehicle 1) in order to be hidden from the view from the driver of the vehicle 1 (i.e. not visible to the driver).

According to a possible embodiment, the exact inclination of the support body 7 with respect to the vertical could be modifiable by the driver (typically when the height of the driver varies) in order to obtain the best possible readability of the displaying device 10.

According to a preferred embodiment shown in the appended Figures, the support body 7 moves between the first position (shown in FIGS. 2, 3 and 4) and the second position (shown in FIG. 1) with a purely rotary motion around the rotation axis 11. In particular, there is provided an actuator device 12 which is configured to rotate the support body 7 around the rotation axis 11.

According to the embodiment shown in FIGS. 5-9, the control panel 5 comprises a support body 13 that has its own front wall 14 and is constrained to the support body 7 so as to rotate together with the support body 7 around the rotation axis 11; that is, the support body 13 is rigidly and firmly connected to the support body 7 so as to form a single indivisible unit that moves (rotates) always together. The control panel 5 comprises (at least) a displaying device 15 which is configured to display information and is housed in the support body 13 in the area of the front wall 14.

In the first position (shown in FIGS. 6 and 7) the front wall 14 of the support body 13 is oriented upward and is arranged so as to be hidden from the view of the driver of the vehicle 1 (also because it is covered by the support body 7) and in the second position (shown in FIGS. 5, 8 and 9) the front wall 14 of the second support body 13 is arranged substantially vertical (actually slightly inclined by a few degrees with respect to the vertical to be more easily readable by the driver whose head is arranged higher than the control panel 5) so as to be viewed by the driver of the vehicle 1 (i.e. visible to the driver).

According to what is shown in FIGS. 5-9, the support body 13 is constrained to the support body 7 in the area of the rear wall 9 of the support body 7 which is parallel to and opposite the front wall 8 of the support body 7. Furthermore, the support body 13 is constrained to the support body 7 in the area of an end of the support body 7 which is located in the lowest point in the first position (shown in FIGS. 6 and 7) and is located in the farthest point from the steering wheel 6 in the second position (shown in FIGS. 5, 8 and 9); that is, the support body 13 is constrained to the support body 7 in the area of an end of the support body 13 which is located in the highest point in the first position (shown in FIGS. 6 and 7) and is located in the lowest point in the second position (shown in FIGS. 5, 8 and 9).

Figure 7:
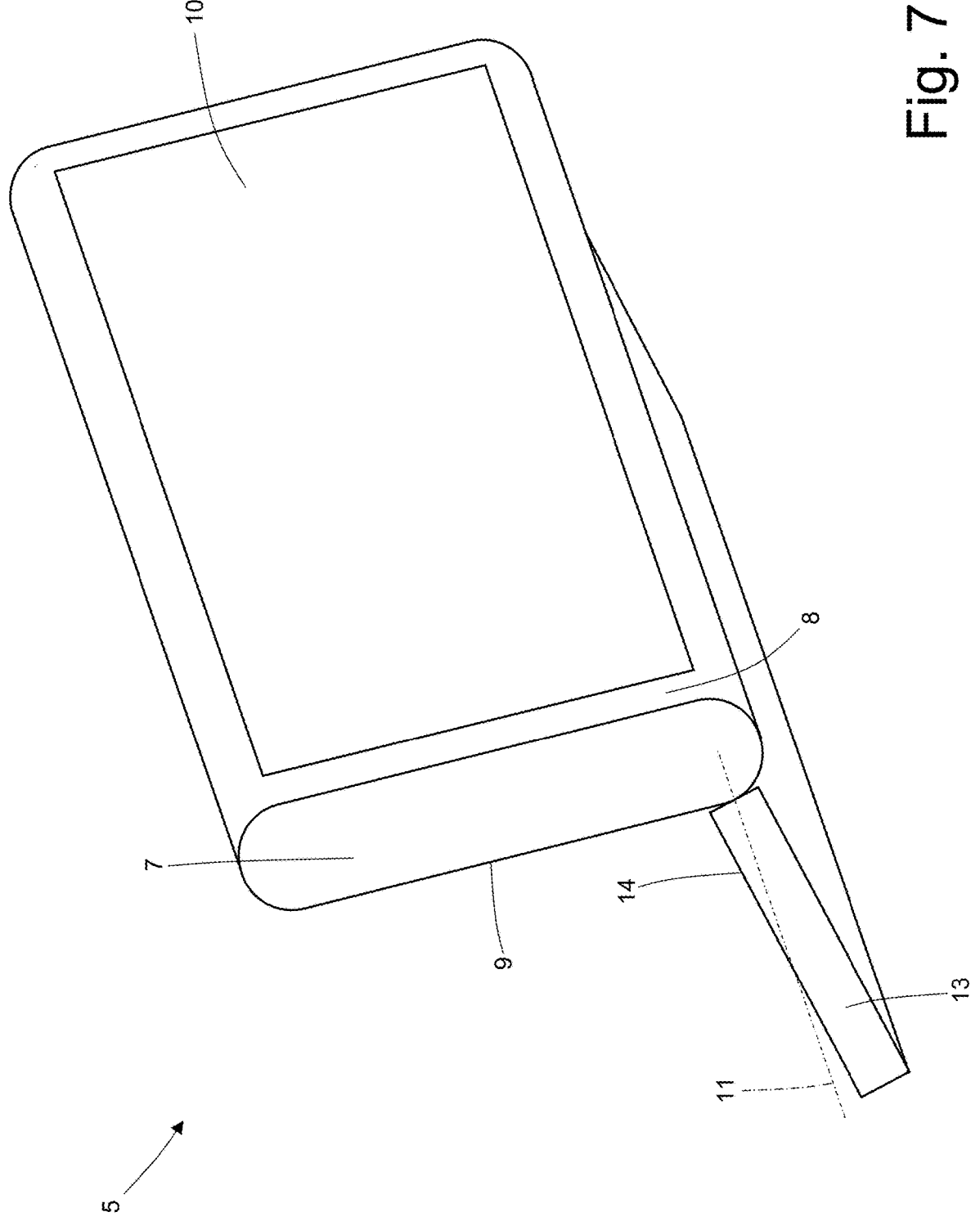
FIGS. 7 and 8 are two perspective and schematic views of the control panel of FIGS. 5 and 6 in two different configurations.

In the embodiment shown in FIG. 7, the displaying device 10 is completely digital and comprises a single digital screen (for example made with the LED technology or with the OLED technology) that entirely occupies the front wall 8 of the support body 7. Alternatively, the displaying device 10 could be completely analogue and comprise a series of analogue instruments each provided with at least one hand or the displaying device 10 could be partially analogue and partially digital and comprise both at least one digital screen (for example made with the LED technology or with the OLED technology), and at least one analogue instrument provided with a hand.

Figure 8:
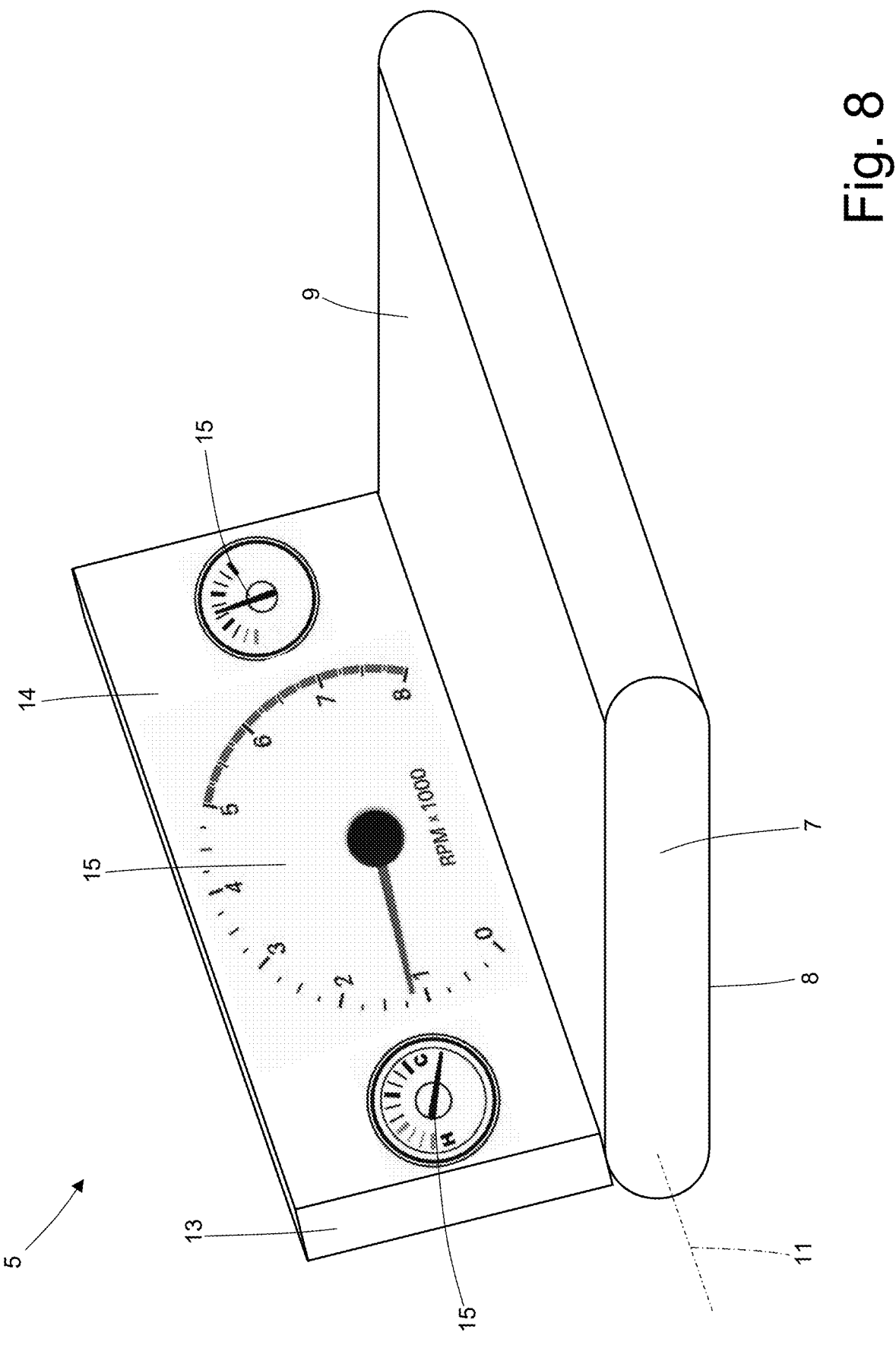

In the embodiment shown in FIG. 8, the displaying device 15 is completely analogue and comprises a series of analogue instruments each provided with at least one hand. In the embodiment shown in FIG. 9, the displaying device 15 is partially analogue and partially digital and comprises both at least one digital screen (for example made with the LED technology or with the OLED technology), and at least one analogue instrument provided with a hand. According to a further embodiment not shown, the displaying device 15 is completely digital and comprises a single digital screen (for example made with the LED technology or with the OLED technology) that entirely occupies the front wall 14 of the support body 13.

According to a preferred embodiment, only one of the displaying device 10 and the displaying device 15 comprises (at least) an analogue instrument so that in one position the control panel 2 has in front of the driver only a digital screen and in the other position the control panel 2 has in front of the driver (at least) an analogue instrument. That is, only the displaying device 10 is completely digital while the displaying device 15 is at least partially analogue.

Figure 5:
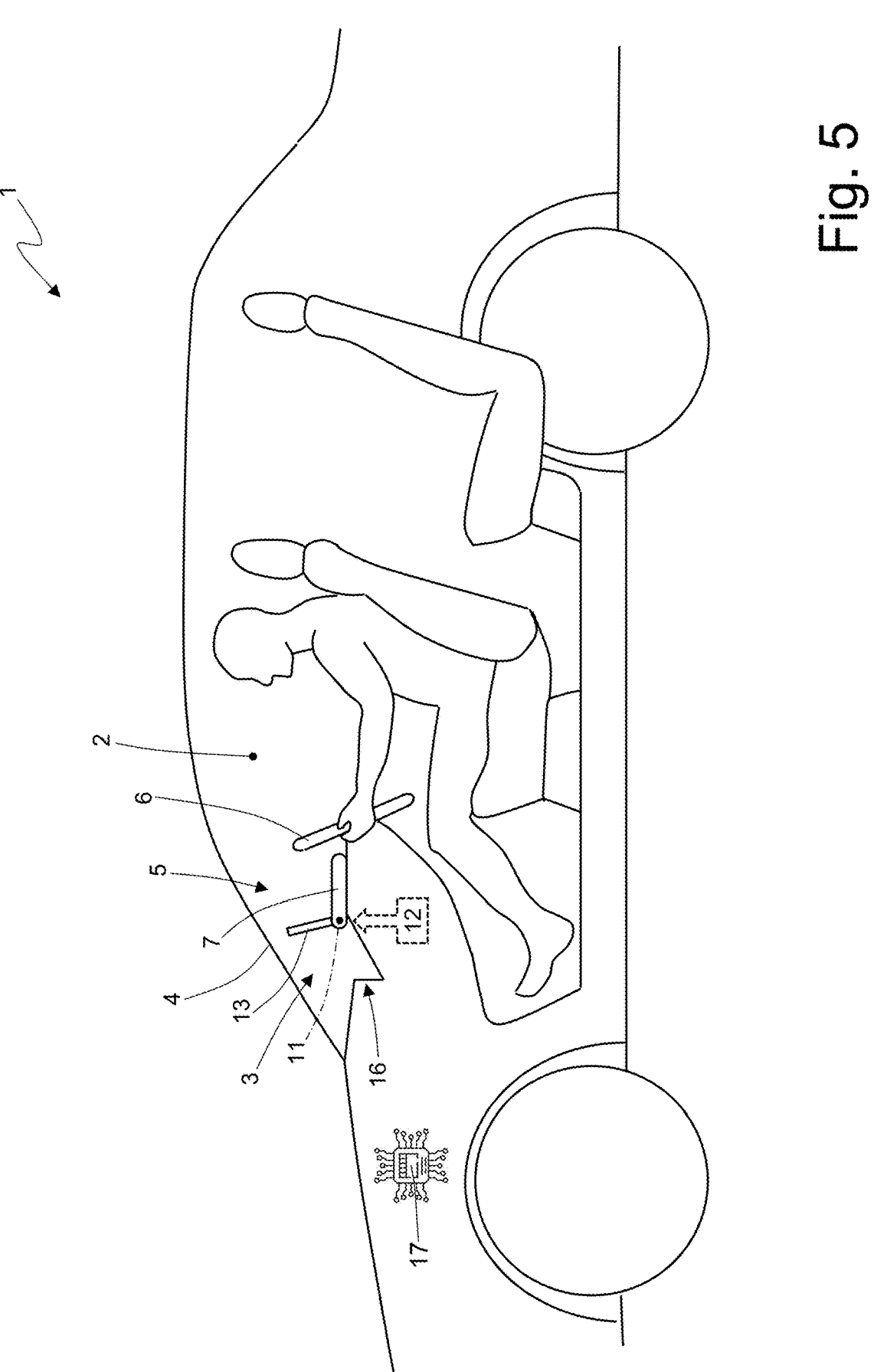
FIGS. 5 and 6 are two schematic views of a car provided with an alternative embodiment of the control panel of FIGS. 1 and 2 and is arranged in two different configurations.
Figure 6:
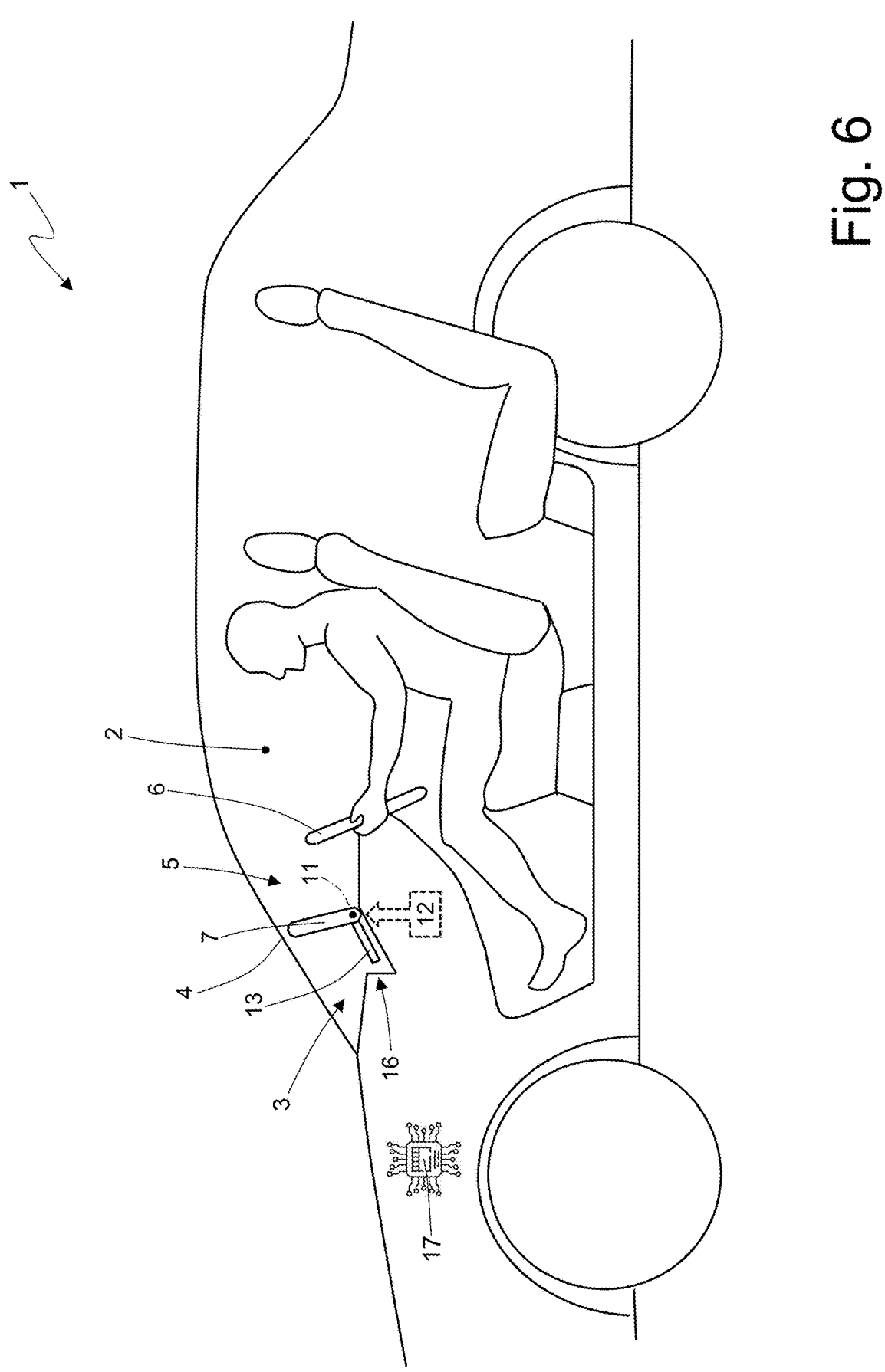
Figure 9:
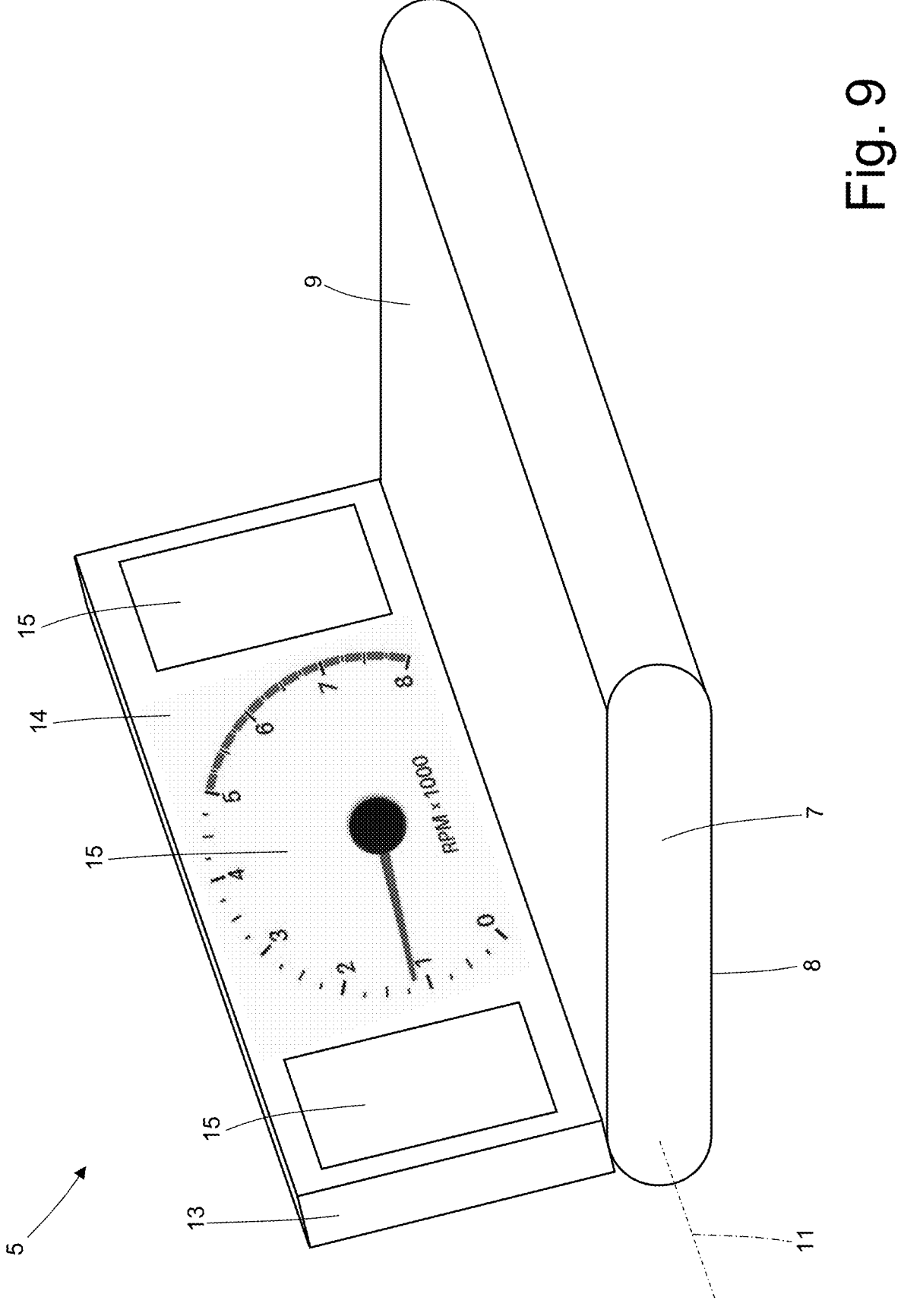
FIG. 9 is a perspective and schematic view of a variant of the control panel of FIGS. 5 and 6.

The front walls 8 and 14 of the two support bodies 7 and 13 form between them an angle equal to an angular range of the rotation around the rotation axis 11 needed to shift from the first position (shown in FIGS. 6 and 7) to the second position (shown in FIGS. 5, 8 and 9). According to a preferred embodiment, the front walls 8 and 14 of the two support bodies 7 and 13 form between them an angle exceeding 90° (for example equal to 100-105°).

According to a preferred embodiment, the front wall 8 of the support body 7 is more extended (larger) than the front wall 8 of the support body 13.

According to a preferred embodiment, in the first position (shown in FIGS. 6 and 7) the support body 13 is arranged in a housing 16 obtained through an upper wall of the dashboard 3 of the vehicle 1.

Summarizing what is described above, the support bodies 7 and 13 are mounted integrally in a rotary manner so as to rotate together around the rotation axis 11 between the first position (shown in FIGS. 6 and 7) in which the front wall 8 of the support body 7 is arranged to be viewed by the driver of the vehicle 1 and the front wall 14 of the second support body 13 is arranged to be hidden from the view of the driver of the vehicle 1 and the second position (shown in FIGS. 5, 8 and 9) in which the front wall 8 of the support body 7 is arranged to be hidden from the view of the driver of the vehicle 1 and the front wall 14 of the support body 13 is arranged to be viewed by the driver of the vehicle 1.

The two bodies 7 and 13 are constrained to each other so as to form together an "L"-shaped structure wherein each body 7 or 13 constitutes a leg of the "L"; moreover, the support body 13 is constrained to the support body 7 in the area of an end of the support body 7 which is located in the lowest point in the first position (shown in FIGS. 6 and 7) and is located in the farthest point from the steering wheel 6 of the vehicle 1 in the second position (shown in FIGS. 5, 8 and 9). In particular, the rotation axis 11 is arranged in the area of the end of the support body 7 in which the support body 13 is constrained (i.e. the rotation axis 11 is arranged in the area of the end of the support body 13 in which the support body 7 is constrained).

In the first position (shown in FIGS. 6 and 7) the front wall 8 of the support body 7 is arranged substantially vertical and faces the driver of the vehicle 1 and the front wall 14 of the support body 13 is arranged substantially horizontal and faces upward; instead, in the second position (shown in FIGS. 5, 8 and 9) the front wall 8 of the support body 7 is arranged substantially horizontal and faces downward and the front wall 14 of the support body 13 is arranged substantially vertical and faces the driver of the vehicle 1.

According to what is shown in FIGS. 1-2 and 5-6, the control panel 5 comprises a control unit 17.

In the embodiment shown in FIGS. 1-4, the control unit 17 is configured to move the support body 7 to the second position (shown in FIGS. 2-4) when the vehicle is turned on (i.e. when the vehicle 1 is in the so-called "KEY-ON" condition) and to move the support body 7 to the first position (shown in FIG. 1) when the vehicle is turned off (i.e. when the vehicle 1 is in the so-called "KEY-OFF" condition). In this way, when the vehicle 1 is turned on, the displaying device 10 is shown, providing the driver with a clear and consistent indication that the vehicle 1 has been turned on.

In the embodiment shown in FIGS. 5-9, the control unit 17 is configured to move the support body 7 (and thus the support body 13) to the second position (shown in FIGS. 6-7) in a road driving mode (i.e. suitable to be used on roads open to the public and subject to the limits imposed by the traffic code) and to move the support body 7 to the first position (shown in FIGS. 5, 8 and 9) to a performance driving mode (i.e. suitable to be used on a track). In this way, in the road driving mode the driver is shown the displaying device 10 which is completely digital while in the performance driving mode the driver is shown the displaying device 15 which is at least partially analogue.

The control unit 17 can be configured to move the support body 7 to the position desired by the driver regardless of the state (turned on or off) of the vehicle 1 and regardless of the driving mode set by the driver.

The embodiments described herein can be combined with each other without departing from the scope of protection of the present invention.

The control panel 5 described above finds advantageous application in any type of road vehicle (for example a car or a motorcycle) and also in any type of non-road vehicle.

The control panel 5 described above has numerous advantages.

Firstly, the control panel 5 described above allows information to be displayed so that the driver can, in all the driving situations, acquire the data he need with as little distraction as possible. This result is obtained thanks to the fact that, depending on the driving situation and/or the driver's wishes, the information can be displayed in a differentiated manner by using different displaying means (by rotating the support bodies 7 and 13 it is possible to modify the displaying means arranged in the control panel 5 in front of the driver).

In this regard, it is important to note that information displayed in a completely digital form can be completer and more detailed, while information displayed in analogue or hybrid form (by combining analogue and digital together) are less complete and detailed but more quickly perceptible (being sufficient to see the position of the hands without actually reading the numerical scale associated with the hands). It would also be possible to digitally reproduce the hands; however, it has been demonstrated that the visibility of a physical hand is decidedly higher than the visibility of a hand displayed on a secondary digital screen (particularly because the physical hand creates a three-dimensionality that facilitates the vision of the physical hand).

In other words, the control panel 5 described above allows the information to be displayed using the completely digital displaying device 10 when the driver requires the presentation of complex information (typically a cartographic navigator during "quiet" driving) and also allows to use the displaying device 15 which is at least partially analogue when the driver requires this type of instrumentation for "sporty" driving. In other words, the control panel 5 described above does not constitute a watered-down compromise between the need to have a large-sized digital screen and the contrasting need to also have a large-sized analogue displaying device; in fact, the control panel 5 described above allows to have (at different times) both a large-sized digital screen and an analogue displaying device depending on the driver's wishes.

In addition, the control panel 5 described above has a particularly small footprint and therefore can be integrated into any type of vehicle.

Finally, the control panel 5 described above has a relatively low production cost as it uses simple components easily available on the market.

LIST OF REFERENCE NUMBERS OF THE FIGURES 1 road vehicle
2 passenger compartment
3 dashboard
4 windscreen
5 control panel
6 steering wheel
7 support body
8 front wall
9 rear wall
10 displaying device
11 rotation axis
12 actuator device
13 support body
14 front wall
15 displaying device
16 housing
17 control unit

The invention claimed is:

1. A control panel for a vehicle and comprising:
a first support body having its own front wall;
at least one first displaying device, which is configured to display information and is housed in the first support body in the area of the front wall;
a second support body which has its own front wall and is integral with the first support body;
at least one second displaying device which is configured to display information and is housed in the second support body in the area of the front wall; and
a control unit;
wherein the support bodies are mounted integrally in a rotary manner so as to rotate together around a rotation axis between a first position, in which the front wall of the first support body is arranged to be viewed by a driver of the vehicle and the front wall of the second support body is arranged to be hidden from the view of the driver of the vehicle and a second position, in which the front wall of the first support body is arranged to be hidden from the view of the driver of the vehicle and the front wall of the second support body is arranged to be viewed by the driver of the vehicle;
wherein the two bodies are constrained to each other so as to form together an "L" structure wherein each body constitutes a leg of the "L", and
wherein the control unit is configured to move the first support body to the second position in a road driving mode suitable to be used when driving on roads open to the public and to move the first support body to the first position in a performance driving mode suitable to be used when driving on a track.

2. The control panel according to claim 1, wherein the second support body is constrained to the first support body in the area of an end of the first support body which is located in the lowest point in the first position and is located in the farthest point from a steering wheel of the vehicle in the second position.

3. The control panel according to claim 1, wherein the second support body is constrained to the first support body in the area of an end of the second support body which is located in the highest point in the first position and is located in the lowest point in the second position.

4. The control panel according to claim 1, wherein the rotation axis is arranged in the area of the end of the first support body in which the second support body is constrained.

5. The control panel according to claim 1, wherein:
in the first position the front wall of the first support body is arranged substantially vertical and faces the driver of the vehicle and the front wall of the second support body is arranged substantially horizontal and faces upward; and
in the second position the front wall of the first support body is arranged substantially horizontal and faces downward and the front wall of the second support body is arranged substantially vertical and faces the driver of the vehicle.

6. The control panel according to claim 1, wherein:
the first support body moves between the first position and the second position with a purely rotary motion around the rotation axis; and
the front walls of the two support bodies form, between them, an angle equal to an angular range of the rotation around the rotation axis needed to shift from the first position to the second position.

7. The control panel according to claim 1, wherein the second support body is constrained to the first support body in the area of a rear wall of the first support body parallel to and opposite the front wall of the first support body.

8. The control panel according to claim 1, wherein only one of the first displaying device and the second displaying device comprises an analogue instrument.

9. The control panel according to claim 8, wherein the front walls of the two support bodies form, between them, an angle exceeding 90°.

10. The control panel according to claim 1, wherein the front wall of the first support body is more extended than the front wall of the second support body.

11. The control panel according to claim 10, wherein only the first displaying device is completely digital and the second displaying device is at least partially analogue.

12. The control panel according to claim 1, wherein in the first position the second support body is arranged in a housing obtained through an upper wall of a dashboard of the vehicle.

13. The control panel according to claim 1, wherein in the second position the front wall of the first support body is facing an upper wall of a dashboard of the vehicle.

* * * * *